US006445251B1

(12) United States Patent
Robinson

(10) Patent No.: US 6,445,251 B1
(45) Date of Patent: **\*Sep. 3, 2002**

(54) VARIABLE GAIN AMPLIFIER WITH HIGH LINEARITY AND LOW NOISE

(75) Inventor: Trevor Robinson, Huntington Beach, CA (US)

(73) Assignee: Conexant Systems, Inc., Newport Beach, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 103 days.

(21) Appl. No.: 09/163,892

(22) Filed: Sep. 30, 1998

(51) Int. Cl.$^7$ ................................................ H03F 3/45
(52) U.S. Cl. ................................................... 330/254
(58) Field of Search ................................. 330/252, 254; 327/359

(56) References Cited

U.S. PATENT DOCUMENTS

| | | | | |
|---|---|---|---|---|
| 4,227,256 A | * | 10/1980 | O'Keefe | 330/254 X |
| 4,464,633 A | * | 8/1984 | Harwood et al. | 330/254 |
| 4,818,951 A | * | 4/1989 | Roberts | 330/254 |
| 5,047,731 A | | 9/1991 | Lee | 330/282 |
| 5,146,180 A | | 9/1992 | Hyakutake | 330/254 |
| 5,418,494 A | * | 5/1995 | Betti et al. | 330/254 |
| 5,451,901 A | | 9/1995 | Welland | 330/133 |
| 5,467,057 A | | 11/1995 | Joardar | 330/254 |
| 5,477,191 A | | 12/1995 | Demicheli | 330/254 |
| 5,625,321 A | | 4/1997 | Sasaki et al. | 330/124 R |
| 5,977,828 A | * | 11/1999 | Hu et al. | 330/254 |

OTHER PUBLICATIONS

"Receiver IC Buttresses Spread–Spectrum Systems," Product Technology, Leendart B. Quist.

* cited by examiner

*Primary Examiner*—Steven J. Mottola
(74) *Attorney, Agent, or Firm*—Thomas, Kayden, Horstemeyer & Risley LLP

(57) ABSTRACT

A variable gain amplifier that has a high linearity gain stage coupled with a low noise gain stage, and a steering circuit that steers the input signal between these two stages depending on the gain requirement. The preferred embodiment employs steering of the input signal and extensive linearization (in dB) of the control signal to provide stable and linear gain control and high dynamic range. One embodiment includes a first differential amplifier stage having no emitter degeneration and configured to receive a differential input signal and contribute to an output signal current; a second differential amplifier stage having emitter degeneration and higher linearity than the first differential amplifier stage, and configured to receive the differential input signal and contribute to the output signal current; a first current source coupled to the first differential amplifier stage and regulated by a control signal X according to the formula I*(K−x), where K is a constant and x is a variable ranging from 0 to K; a second current source coupled to the second differential amplifier stage and regulated by a control signal X according to the formula I*(x); and a signal steering circuit, coupled to the first and second differential amplifier stages, for steering the output signal current from the first and second differential amplifier stages either to a voltage source or to a corresponding load resistor.

12 Claims, 1 Drawing Sheet

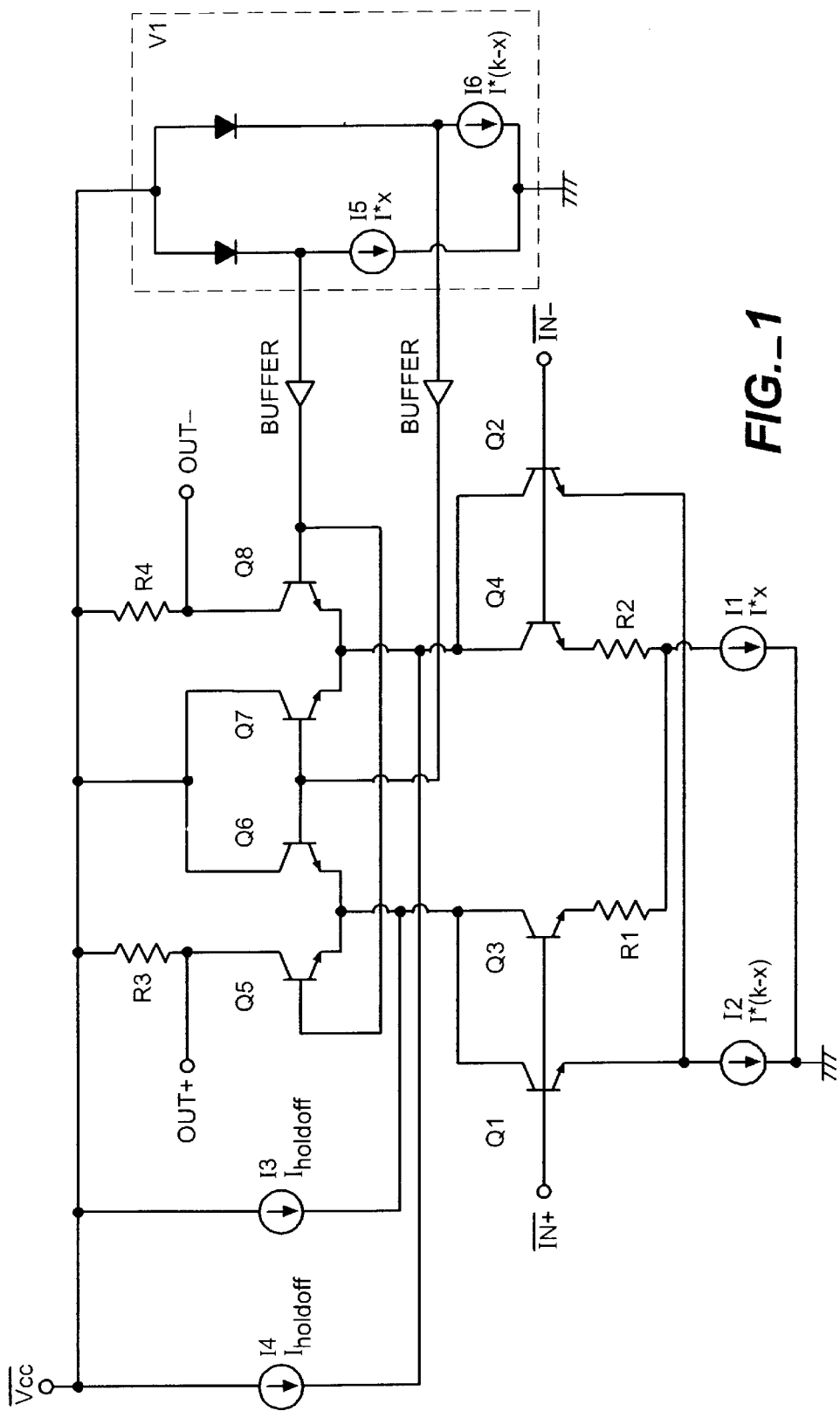
FIG._1

VARIABLE GAIN AMPLIFIER WITH HIGH LINEARITY AND LOW NOISE

RELATED APPLICATIONS

This application is related to co-pending U.S. patent application Ser. No. 09/163,885 entitled "VARIABLE GAIN AMPLIFIER WITH GAIN LINEAR WITH CONTROL VOLTAGE", filed Sep. 30, 1998, and assigned to the assignee of the present invention, the teachings of which are hereby incorporated by reference.

TECHNICAL FIELD

This invention relates to electronic circuits, and more particularly to an electronic variable gain amplifier with high linearity and low noise.

BACKGROUND

In a radio frequency (RF) transceiver, the received signal has a high dynamic range (>80 dB). In order to supply a signal of constant amplitude to a baseband section of the transceiver, a variable gain amplifier (VGA) with equivalent or better dynamic range is required. It is desirable that the VGA exhibit low noise when a small signal is present at the input in a high gain mode, and yet be able to handle a large input signal when in a low gain mode. Accordingly, the VGA should exhibit high linearity in low gain mode. Known solutions fail to provide a VGA that has sufficiently low noise, high linearity, linear gain control, temperature stable gain control, and a high dynamic range that are all suitable for some applications (such as a code division multiple access (CDMA) receiver).

Accordingly, the inventor has perceived that there is a need for a variable gain amplifier which has such characteristics. The present invention provides such an amplifier.

SUMMARY

The invention includes a variable gain amplifier that has a high linearity gain stage coupled with a low noise gain stage, and a steering circuit that steers the input signal between these two stages. The preferred embodiment employs steering of the input signal and extensive linearization (in dB) of the control signal to provide stable and linear gain control and high dynamic range.

In particular, in one aspect the invention includes a first differential amplifier stage having low noise (i.e., no emitter degeneration in a bipolar implementation) and configured to receive a differential input signal and contribute to an output signal current; a second differential amplifier stage that has higher linearity than the first differential amplifier stage (but has more noise, i.e., exhibits emitter degeneration in a bipolar implementation), and configured to receive the differential input signal and contribute to the output signal current; a first current source coupled to the first differential amplifier stage and regulated by a control signal x according to the formula $I*(k-x)$, where k is a constant and x is a variable ranging from 0 to k; a second current source coupled to the second differential amplifier stage and regulated by a control signal x according to the formula $I*(x)$; and a signal steering circuit, coupled to the first and second differential amplifier stages, for steering the output signal current from the first and second differential amplifier stages either to a voltage source or to a corresponding load.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 is a schematic diagram of the preferred embodiment of the present invention.

Like reference numbers and designations in the various drawings indicate like elements.

DETAILED DESCRIPTION

FIG. 1 shows a schematic diagram of a preferred embodiment of the present invention. The inventive circuit is shown as being implemented in bipolar circuitry. However, a comparable circuit can be implemented in other technologies, such as complimentary metal oxide semiconductor (CMOS) field effect transistors (FET). Accordingly, the embodiment shown in FIG. 1 should be taken as exemplary only.

In the preferred embodiment, differential IF inputs $\overline{IN}+$, $\overline{IN}-$ are respectively coupled to the bases of transistors Q1, Q3, and Q2, Q4. Transistors Q1 and Q2, along with current source I2, form a first differential amplifier stage with low noise (no emitter degeneration in the illustrated bipolar embodiment). Transistors Q3 and Q4, along with resistors R1 and R2 and current source I1, form a second differential amplifier stage with higher linearity than the Q1, Q2 amplifier stage but also higher noise (emitter degenerated in the illustrated bipolar embodiment). The input signal current passes through load resistors R3 and R4 to obtain a voltage gain at output terminals OUT+, OUT−.

The current sources I1, I2 are regulated by a control signal x, which is varied between values of "0" and "k", where k is a constant. In the preferred embodiment, k equals 2. As the control signal x is varied between its minimum and maximum values, current will be shared between the two differential amplifier stages in accordance with the formulas shown in FIG. 1. At each limit of the control range, one amplifier stage will be fully on, while the other amplifier stage will be starved of current and thus fully off. The control signal x is set under user control, in known fashion.

To further improve the dynamic range of the variable gain amplifier section, transistors Q5, Q6, Q7, and Q8 act to steer the signal current from the input differential pairs Q1, Q2 and Q3, Q4, respectively, either to a voltage source $\overline{V}_{cc}$ (through transistors Q6 and Q7), or to the load resistors R3, R4 (through transistors Q5 and Q8). The steering signal for transistors Q5, Q6, Q7, and Q8 is the output of a voltage source V1 that is preferably related to the control signal x in such a way as to produce an overall linear gain versus control signal response. In particular, transistors Q5 and Q8 are steered by a voltage that is proportional to a current $I*x$ from current source I5, and transistors Q6 and Q7 are steered by a voltage that is proportional to a current $I*(k-x)$ from current source I6, where x and k are as defined above. Further details of a suitable voltage source for generating the desired control signal output are taught in the above-referenced co-pending U.S. Patent Application.

In an alternative embodiment, V1 may equal a bias voltage, $V_{bias}$, plus $V_{ref}*(x-k/2)$, where x and k are as defined above, and $V_{ref}$ is a reference voltage. If k=2, V1 equals $V_{bias}+V_{ref}*(x-1)$. As the control signal x is varied between its minimum and maximum values (0 to k, in this example), V1 ranges from $V_{bias}-V_{ref}$ to $V_{bias}+V_{ref}$.

Current sources I3 and I4 act to maintain some standing currents through transistors Q1, Q2 and Q3, Q4, respectively, so that as one of the amplifier stages starts to turn on, none of its signal current will reach the load resistors R3, R4 until the emitter current for the transistors in that stage equals the associated holdoff current for such transistors. For example, no signal current from transistors Q1 and Q2 reaches the load resistors R3, R4 until current source I2 has a value greater than $I_{holdoff}$. This feature enables the circuit to maintain its linearity across a wider control signal range, controllable by the value of $I_{holdoff}$ compared to the value of current sources I1 and I2.

A number of embodiments of the present invention have been described. Nevertheless, it will be understood that various modifications may be made without departing from the spirit and scope of the invention. Accordingly, other embodiments are within the scope of the following claims.

What is claimed is:

1. A variable gain amplifier including:
   (a) a first differential amplifier stage having low noise and configured to receive a differential input signal and contribute to an output signal current;
   (b) a second differential amplifier stage having higher linearity than the first differential amplifier stage, and configured to receive the differential input signal and contribute to the output signal current;
   (c) a first current source coupled to the first differential amplifier stage and regulated by a control signal x according to the formula I*(k−x), where k is a constant and x is a variable ranging from 0 to k;
   (d) a second current source coupled to the second differential amplifier stage and regulated by the control signal x according to the formula I*(x); and
   (e) a signal steering circuit, coupled to the first differential amplifier stage and the second differential amplifier stage, for steering the output signal current from the first differential amplifier stage and the second differential amplifier stage either to a voltage source or to a corresponding load.

2. The variable gain amplifier of claim 1, further including a first standing current source coupled to the first differential amplifier stage and a second standing current source coupled to the second differential amplifier stage, for maintaining a standing current to each such differential amplifier stage for improved linearity.

3. The variable gain amplifier of claim 1, wherein k equals two.

4. The variable gain amplifier of claim 1, further including a voltage source coupled to the signal steering circuit for providing a control voltage V1 that is related to the control signal x so as to produce an overall linear gain versus control signal response.

5. The variable gain amplifier of claim 4, wherein V1 equals a bias voltage, $V_{bias}$, plus $V_{ref}$*(x−k/2), where $V_{ref}$ is a reference voltage.

6. A method of varying gain in an amplifier circuit, including the steps of:
   (a) applying a differential input signal to a first differential amplifier stage having low noise and configured to contribute to an output signal current;
   (b) applying the differential input signal to a second differential amplifier stage having higher linearity than the first differential amplifier stage, and configured to contribute to the output signal current;
   (c) varying current to the first differential amplifier stage in response to a control signal x according to the formula I*(k−x), where k is a constant and x is a variable ranging from 0 to k;
   (d) varying current to the second differential amplifier stage in response to the control signal x according to the formula I*(x); and
   (e) steering the output signal current from the first differential amplifier stage and the second differential amplifier stage either to a voltage source or to a corresponding load resistor.

7. The method of 6, further including the step of maintaining a standing current to each of the first and second differential amplifier stages for improved linearity.

8. The method of 6, wherein k equals two.

9. The method of 6, wherein the step of steering the output signal current includes applying a control voltage V1 that is related to the control signal x so as to produce an overall linear gain versus control signal response.

10. The method of 9, wherein V1 equals a bias voltage, $V_{bias}$, plus $V_{ref}$*(x−k/2), where $V_{ref}$ is a reference voltage.

11. The variable gain amplifier of claim 1, further comprising:
   a first holdoff current source coupled to a first half of the first differential amplifier stage and a first half of the second differential amplifier stage; and
   a second holdoff current source coupled to a second half of the first differential amplifier stage and a second half of the second differential amplifier stage.

12. The method of claim 6, further comprising:
   applying a first holdoff current to a first half of the first differential amplifier stage and a first half of the second differential amplifier stage; and
   applying a second holdoff current to a second half of the first differential amplifier stage and a second half of the second differential amplifier stage.

* * * * *